United States Patent
Morris et al.

(10) Patent No.: US 7,378,845 B2
(45) Date of Patent: May 27, 2008

(54) NMR METHODS FOR MEASURING FLUID FLOW RATES

(75) Inventors: Peter Morris, Nottingham (GB); Terry Moore, Ely (GB); Paul Anuzis, Derby (GB); Kenneth Astley, Derby (GB)

(73) Assignee: Rolls-Royce plc, London (GB)

( * ) Notice: Subject to any disclaimer, the term of this patent is extended or adjusted under 35 U.S.C. 154(b) by 0 days.

(21) Appl. No.: 11/348,444

(22) Filed: Feb. 7, 2006

(65) Prior Publication Data
US 2006/0213283 A1 Sep. 28, 2006

Related U.S. Application Data

(63) Continuation of application No. PCT/GB2004/002971, filed on Jul. 8, 2004.

(30) Foreign Application Priority Data
Sep. 10, 2003 (GB) ................... 0321242.0

(51) Int. Cl.
*G01V 3/00* (2006.01)
(52) U.S. Cl. ..................... 324/306
(58) Field of Classification Search .......... 324/306
See application file for complete search history.

(56) References Cited

U.S. PATENT DOCUMENTS

| 4,536,711 | A |   | 8/1985  | King         |         |
|-----------|---|---|---------|--------------|---------|
| 4,621,234 | A |   | 11/1986 | Caprihan     |         |
| 4,782,295 | A |   | 11/1988 | Lew          |         |
| 5,309,100 | A | * | 5/1994  | Song et al.  | 324/306 |
| 6,046,587 | A | * | 4/2000  | King et al.  | 324/306 |
| 2003/0052675 | A1 | * | 3/2003 | Speier et al. | 324/303 |
| 2004/0140800 | A1 | * | 7/2004 | Madio et al. | 324/303 |

FOREIGN PATENT DOCUMENTS

| DE | 2 501 794 A   | 7/1976  |
|----|---------------|---------|
| EP | 1 060 706 A   | 12/2000 |
| WO | WO 98/59220 A | 12/1998 |

\* cited by examiner

*Primary Examiner*—Brij Shrivastav
*Assistant Examiner*—Megann E Vaughn
(74) *Attorney, Agent, or Firm*—W. Warren Taltavull; Manelli Denison & Selter PLLC

(57) ABSTRACT

A method for measuring fluid flow rates comprises the steps of: (a) creating a non-oscillating magnetic field of a predetermined strength across a flowing fluid; (b) performing the sub-steps of: (i) exposing the flowing fluid to an oscillating magnetic field pulse orthogonal to the non-oscillating magnetic field to generate an NMR signal, and (ii) detecting the NMR signal from the flowing fluid in the form of a free induction decay; and (c) determining the fluid flow rate from the initial magnitude of the free induction decay.

3 Claims, 6 Drawing Sheets

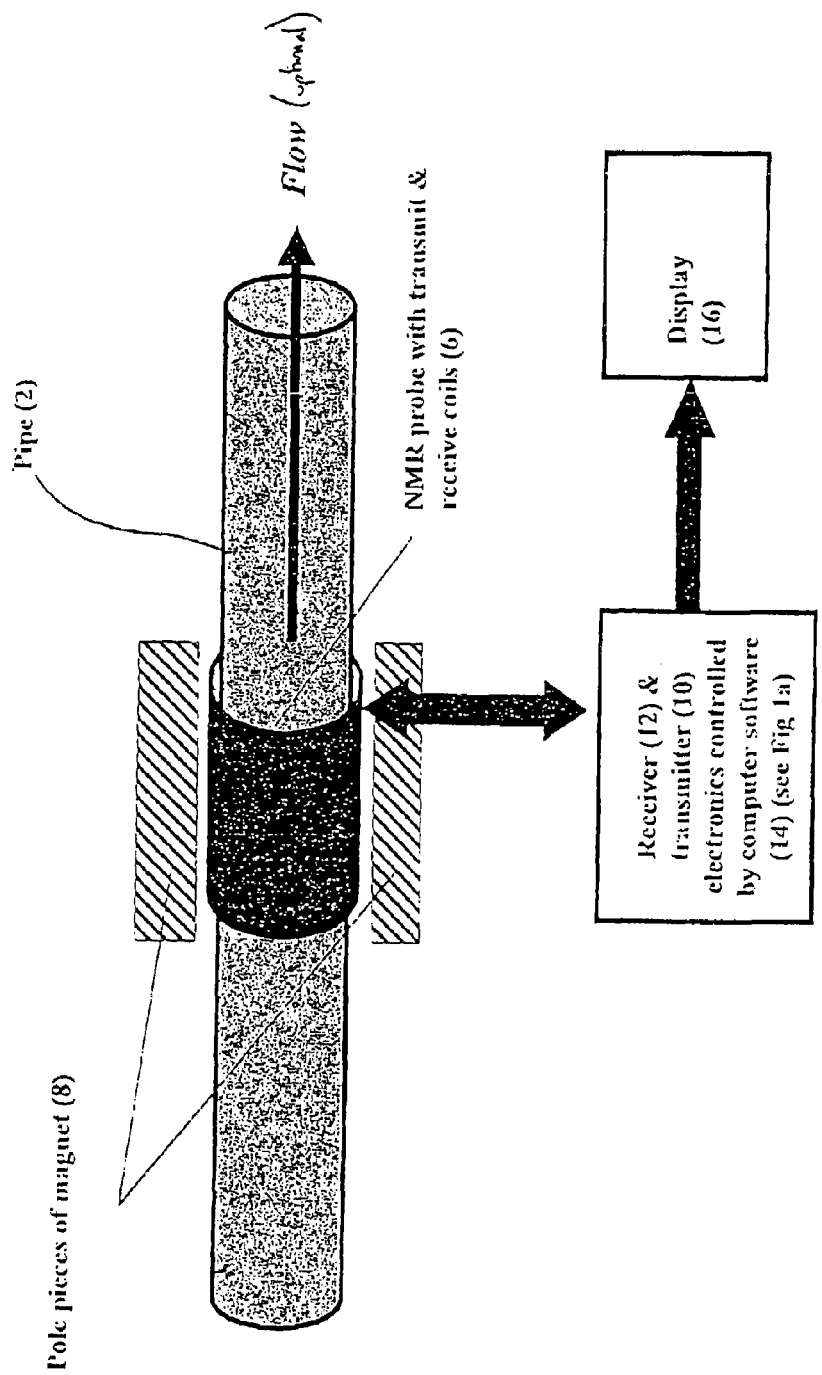

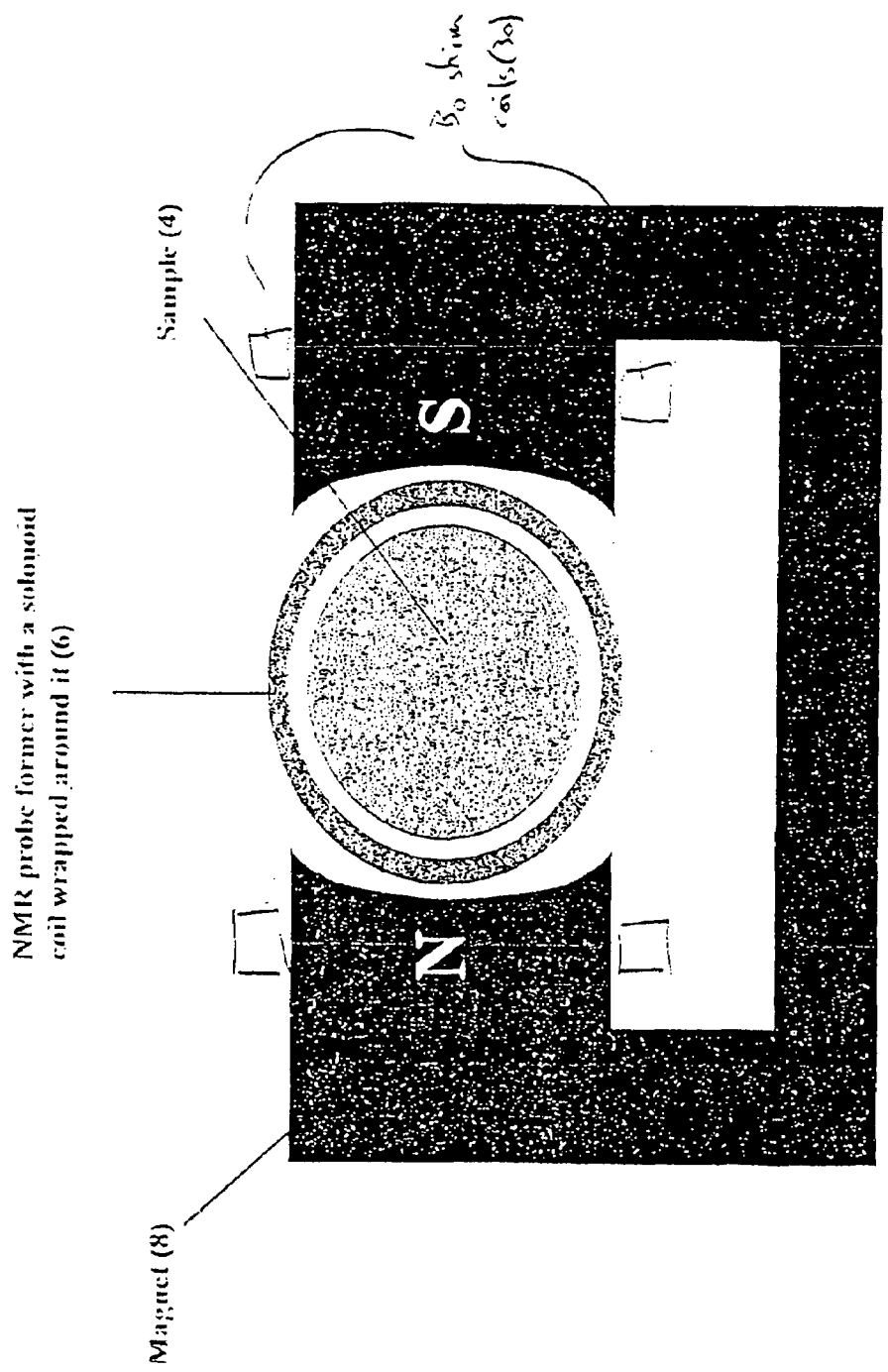

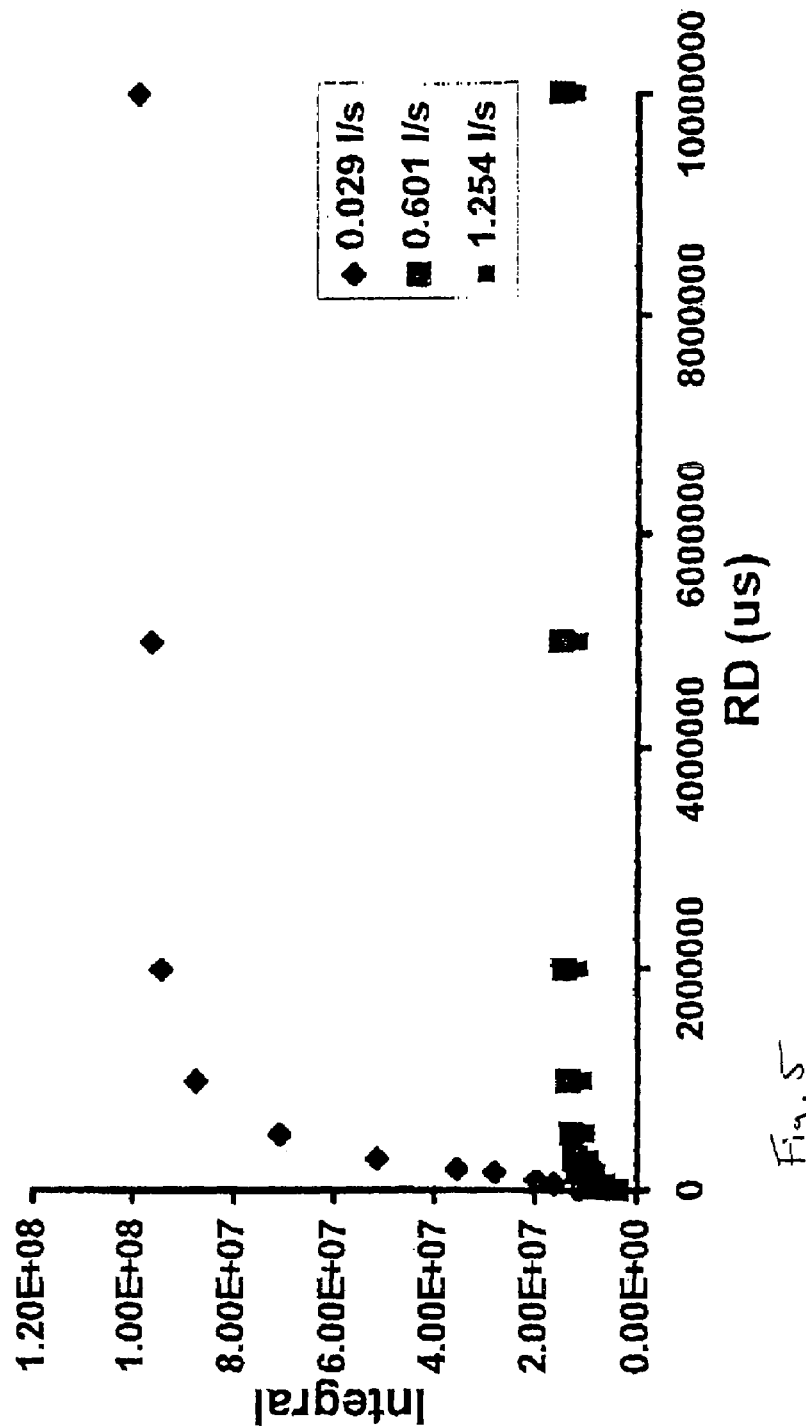

NMR METHODS FOR MEASURING FLUID FLOW RATES

This is a continuation of International Application Number PCT/GB2004/002971 filed Jul. 8, 2004, designating the United States.

FIELD OF THE INVENTION

This invention is generally concerned with Nuclear Magnetic Resonance (NMR) methods for measuring fluid flow rates. In particular, although not necessarily exclusively, the fluid may be oil (e.g. engine lubricating or cooling oil), fuel, coolants (e.g. water) or hydraulic fluid in a power plant or other machinery.

BACKGROUND

Accurate flow measurement is increasingly important in many fields. For example, in the field of civil aircraft, increases in accuracy in the flow measuring systems used to meter fuel mean that less fuel has to be carried by aircraft to compensate for measuring inaccuracies, which in turn leads to improvements in fuel consumption.

Most mechanical fluid flow measuring devices intrude to some extent into the flow they are set up to measure. This can undesirably affect the flow, expose the measuring device to possibly harmful fluids, and complicate installation of measuring devices into existing fluid systems.

In various industries low resolution NMR machines are used to analyse fluids. For example, the food processing industry uses benchtop NMR systems to detect foreign bodies in production lines. These systems are sometimes enhanced by the addition of special coils which generate one or more field gradients. This technique allows flow cross sections to be imaged. See e.g. Van Dijk, P., (1984), J. Comput. Assist. Tomogr., Vol. 8 (3), 429.

Another known NMR technique for analysing fluid flows (see e.g. Singer, J. R., (1972), Science, Vol. 175, 794) uses a time of flight approach to determine mass flow rates.

Compared with mechanical fluid flow measuring devices, both these NMR techniques have the advantage of no moving parts. However, the gradient coil requires additional (generally heavy and expensive) field gradient amplifiers and control circuits, and the time of flight approach requires a separate detector coil and is limited by the relaxation time of the fluid.

Thus, it would be desirable to have an NMR technique for analysing fluid flows which is accurate, non-intrusive and is capable of providing flow rate information.

It is useful at this point to provide a brief overview of the relevant NMR theory.

Certain atomic nuclei possess angular momentum and the quantum property of "spin". Because the nuclei also carry a charge, specifically a positive charge, there is a magnetic moment associated with this spin. When placed in a magnetic field, these nuclei, which might be referred to as the nuclear "magnets", tend to align with the field direction. Only certain orientations are possible—two in the case of a spin ½ nucleus such as a proton.

The energy difference between the orientations of the nuclei ("Zeeman splitting") depends linearly on the strength of the magnetic field B. Transitions between the two orientations can be induced when the frequency of an applied oscillating magnetic field (normally electromagnetic radiation such as a radio frequency (RF) signal), exactly matches the energy difference. This so called resonance condition, is defined by the Larmor equation:

$$\omega = \gamma B$$

where $\omega$ is the angular frequency of the oscillating magnetic field (electromagnetic radiation) and $\gamma$, referred to as the magnetogyric ratio, is a constant for a particular nuclear species.

Different nuclei have different values of $\gamma$ and so resonate at different frequencies in a magnetic field of given strength. For example, at 11.7 T, resonant frequencies for the following nuclei are: $^1$H—500 MHz; $^{13}$C—125.7 MHz; $^{27}$Al—130.3 MHz; $^{29}$Si—99.3 MHz; $^{51}$V—131.5 MHz; $^{53}$Cr—28.3 MHz; $^{55}$Mn—123.3 MHz; $^{59}$Co—118.1 MHz, $^{95}$Mo—32.6 MHz; $^{107}$Ag—23.3 MHz and $^{183}$W—20.8 MHz.

The magnetic field B in the Larmor equation given above is the actual field strength at the nucleus and includes susceptibility effects arising from the bulk magnetic properties of the sample, local variations in these effects due to sample heterogeneity, and the screening effect of the electrons that surround the nucleus itself. Thus:

$$B = B_0(1+\chi)$$

where $\chi$ is the magnetic susceptibility and $B_0$ is the applied magnetic field.

In traditional high resolution NMR, it is the contribution of the screening electrons to $\chi$ that gives the technique its power to analyse chemical structure: the same nucleus (e.g. $^1$H) will experience different magnetic fields depending on the chemical environment, so that chemically distinct nuclei resonate at slightly different frequencies. The range of these chemical shifts for any particular nucleus is, however, small: 0-10 ppm covers most $^1$H resonances of interest. In order to resolve them, the main applied magnetic field $B_0$ must be maintained homogeneous over the sample volume. A few parts in $10^9$ are commonplace and a few parts in $10^{10}$ achievable with spinning samples under ideal conditions.

Modern NMR machines mostly use so-called pulsed NMR spectroscopy. This involves creating a first, non-oscillating magnetic field of a predetermined field strength across the sample, and intermittently exposing the sample to a second, oscillating magnetic field orthogonal to the first to generate an NMR signal. The relatively short pulse width (typically of the order of μs) of the intermittent field makes it possible to simultaneously detect a range of frequencies in the NMR signal.

The trend in modern NMR spectroscopy is towards pulsed NMR with high non-oscillating field strengths and high resolutions. Largely this has been made possible by developments in the technology of superconducting magnets.

In contrast, EP 1191330 describes an approach for detecting anomalies in fluid systems that is suitable for the performance of pulsed NMR at low non-oscillating field strengths (e.g. 1.5 T or less).

In particular, EP 1191330 proposes that such anomalies can be detected and analysed in two ways. The first way is termed "indirect detection" and involves analysing the influence the anomalies have on a signal from the fluid rather than analysing a signal from the anomalies themselves. This is particularly useful for the detection of inhomogeneities, such as particulates, in the fluid. The approach is possible where the particulates have a different magnetic susceptibility than the fluid, because they will then cause local non-uniformities in the magnetic field. This in turn modifies the NMR signal from the fluid, manifesting itself, for instance, in changes of line-width and/or position of the fluid resonance seen in the NMR frequency domain.

The second way is termed "direct detection" and, to the extent that the NMR signal that is detected and analysed does derive directly from a contaminant or additive in the fluid system, it is closer to traditional NMR techniques. Direct detection can be used to detect inhomogeneities or dissolved species in the fluid.

SUMMARY OF THE INVENTION

An insight of the present inventors was that a system such as that described in EP 1191330 could be adapted to provide a non-intrusive method for measuring fluid flow rates.

In general terms a first aspect of the present invention relates to a spin echo approach in which a spin echo is generated by the combination of two (or more) radiofrequency pulses (usually 90° and 180°), orthogonal to a non-oscillating magnetic field. In static samples, the size of the echo decays with increasing time interval between the pulses according to the spin spin relaxation rate. However, for flowing spins, the apparent spin spin relaxation (decay) rate is changed, providing a means for measuring flow. The approach is particularly appropriate for measurements in slower flow regimes.

Thus, in a first aspect the present invention provides a method for measuring fluid flow rates comprising the steps of:

(a) creating a non-oscillating magnetic field of a predetermined field strength across a flowing fluid;
(b) performing the sub-steps of:
  (i) exposing the flowing fluid to a first oscillating magnetic field pulse orthogonal to the non-oscillating magnetic field,
  (ii) after a predetermined time delay, $\tau_1$, exposing the flowing fluid to a second oscillating magnetic field pulse orthogonal to the non-oscillating magnetic field to generate an NMR signal, and
  (iii) after a further time delay of duration $\tau_1$ detecting the NMR signal from the flowing fluid;
(c) repeating step (b) for each of one or more different predetermined time delays, $\tau_2 \ldots \tau_n$; and
(d) determining the fluid flow rate from the predetermined time delays ($\tau_1, \tau_2 \ldots \tau_n$) and the variation in the detected signals.

Preferably, steps (b) and (c) are each repeatedly performed, each performance being preceded by a predetermined time delay which is longer than either (A) the spin relaxation time of the polarised nuclei in the flowing fluid or (B) the time for the flowing fluid to completely replace the previously polarised nuclei with unpolarised nuclei. The detected signals can then be averaged. In general, the more repetitions are performed, the higher the signal to noise ratio will be.

In step (b), sub-steps (ii) and (iii) may be repeatedly performed so that each second oscillating magnetic field pulse is separated from the previous pulse by a time equal to $2\tau$. The detected signals from such an echo train can then be averaged. The echo train procedure allows a faster accumulation of detected signals, which can also improve the signal to noise ratio.

In relation to step (c), signals may be detected for at least 5 or 10 different values of $\tau$, i.e. n may equal at least 5 or 10. The appropriate values for $\tau$ may be determined by prior experiments.

Preferably, in step (d), the fluid flow rate is determined from the constant of proportionality of the variation of the detected signal with $\tau$.

In general terms, a second aspect of the invention relates to a repetition delay approach. When pulsed NMR is performed on a static sample, only that fraction of the magnetisation which recovers (i.e. realigns with the first, non-oscillating magnetic field) in the interval between successive pulses contributes to the signal generated by the next pulse. Thus the amount of signal reduction between successive pulses is characteristic of the static sample.

However, in a flowing fluid sample, there is continual replacement of nuclei affected by the first pulse with "fresh" non-saturated nuclei. This leads to enhanced recovery between pulses and can be determined on the basis of the variation in the detected signals. The repetition delay approach is particularly appropriate for measurements in relatively low flow regimes.

Thus, a second aspect of the present invention provides a method for measuring fluid flow rates comprising the steps of:

(a) creating a non-oscillating magnetic field of a predetermined field strength across a flowing fluid;
(b) repeatedly exposing the flowing fluid to an oscillating magnetic field pulse orthogonal to the non-oscillating magnetic field, a predetermined time delay being imposed between each repetition;
(c) performing the sub-steps of:
  (i) imposing said predetermined time delay,
  (ii) exposing the flowing fluid to the oscillating magnetic field pulse to generate an NMR signal, and
  (iii) detecting the NMR signal from the flowing fluid;
(d) repeating steps (b) and (c) for a different predetermined time delay; and
(e) determining the fluid flow rate from the predetermined time delays and the variation in the detected signals.

The signal generated on exposure of the flowing fluid to the repeated pulse is therefore proportional to the number of nuclei polarised or repolarised by the non-oscillating magnetic field during the time delay.

The appropriate duration for the predetermined time delay will depend on the particular mass flow rate under investigation.

In general, NMR signal detection does not need to be performed at step (b). A purpose of the repeated exposure to the oscillating magnetic field pulse at this step is to allow the system to reach or approach equilibrium before signal detection commences in step (c). The step (b) pulses can be termed "dummy pulses". Preferably, in step (b), the flowing fluid is exposed at least four times to the oscillating magnetic field pulse.

In step (c), sub-steps (i) to (iii) may be repeatedly performed. The detected signals can then be averaged. In general, the more repetitions are performed, the higher the signal to noise ratio will be.

Step (d) may comprise repeating steps (b) and (c) a plurality of times for a number of respective different predetermined time delays. For example, signals may be detected for at least 5 or 10 different such delays. The appropriate durations for the delays may be determined by prior experiments.

Preferably, in step (e), the fluid flow rate is determined from the constant of proportionality of the variation of the detected signal with the duration of delay.

A third aspect of the invention relates to an approach which is particularly appropriate for measurements in relatively high flow regimes. If the repetition delay approach of the previous aspect is performed at high flow rates, substantially all the nuclei detected after one pulse leave the detection coil before the next pulse. However, the present inventors realised that in these circumstances, although the signal is independent of the repetition delay, it does reflect the amount of time the nuclei spend being polarised by the non-oscillating magnetic field. This leads to what we call the "simple pulse acquire" approach.

Thus, the third aspect of the present invention provides a method for measuring fluid flow rates comprising the steps of:
   (a) creating a non-oscillating magnetic field of a predetermined field strength across a flowing fluid;
   (b) performing the sub-steps of:
      (i) exposing the flowing fluid to an oscillating magnetic field pulse orthogonal to the non-oscillating magnetic field to generate an NMR signal, and
      (ii) detecting the NMR signal from the flowing fluid; and
   (c) determining the fluid flow rate from the strength of the detected signal.

At high flow rates, the time the nuclei spend being polarised by the non-oscillating magnetic field, and hence the strength of the detected signal, are inversely proportional to the flow velocity. In contrast to the repetition delay approach of the previous aspect, dummy pulses are not required.

Once calibrated, flow rate can be determined from a single signal measurement. However, preferably in step (b), sub-steps (i) and (ii) are repeatedly performed. The detected signals can then be averaged. In general, the more repetitions are performed, the higher the signal to noise ratio will be, which improves accuracy. Preferably, the delay between each repetition is sufficient to allow substantially all the nuclei excited by the previous pulse to exit the detection coil before the next pulse is applied.

The following optional and preferred features relate to any of the various methods of the invention described above.

Typically, the detected signals are in the form of free induction decays (FIDs).

The magnitude of the decay can be quantified in various ways, e.g. by integrating the middle section of each FID between predetermined limits. This is particularly suitable for the methods of the first and second aspects. The decay magnitudes may be plotted on a graph of decay magnitude against predetermined time delay and the slope of the graph determined. If a calibration plot or table of slope against mass flow rate is provided for a particular fluid system, the slope thus-determined may then be conveniently converted into a flow rate.

For the method of the third aspect, it is preferred to measure the initial magnitude of the FID. This can be accomplished e.g. by extrapolating the FID back to time zero (the centre of the oscillating magnetic field pulse), or alternatively, by determining the area of the Fourier transform of the FID (which should correspond to the initial point in the time domain signal). Other ways of analysing FIDs are known to the skilled person.

Conventionally, NMR is carried out using high magnetic field strengths, often of the order of 5-20 T or more, corresponding to high resonant frequencies (RF signals), in the order of 200-900 MHz for $^1$H, to produce high resolution spectra. However, in preferred implementations, the present invention proposes to use relatively low field strengths and frequencies, preferably field strengths no higher than 1.5 T, more preferably 1 T or less and even more preferably 0.5 T or less, corresponding respectively to $^1$H resonant frequencies of about 64 MHz, 43 MHz and 21 MHz. In fact, $^1$H resonant frequencies as low as 1 MHz, i.e. magnetic field strengths as low as 0.0235 T, are not impractical, and even lower field strengths than this may provide useful results.

This preferred approach gives a low resolution output, the effect of which is that the series of peaks seen in a high resolution frequency spectrum merge to form a single peak or resonance.

It may be thought that this loss of resolution would be disadvantageous, because a degree of information is lost from the NMR signal. However, as explained in EP 1191330, this low resolution approach can provide useful results and has the significant advantage that subsequent analysis is greatly simplified. The possibility it provides for using much less powerful, and hence much smaller magnets than conventional techniques is also a significant advantage.

Preferably, the method is performed such that the detected signal contains the $^1$H resonance of the fluid system, since hydrogen is a common element in many fluids, including for example oils, fuel, water etc. Furthermore, in general, the $^1$H resonance is relatively strong compared to spurious resonances which may arise from the electrical or mechanical components of the NMR apparatus, and which can degrade the signal-to-noise ratio.

The oscillating magnetic field pulses may be provided by one or more coils carrying an alternating current, driven to produce an RF (radio frequency) signal, the magnetic component of which provides the desired field. Conveniently, the same coil may be used to detect the NMR signal.

BRIEF DESCRIPTION OF THE DRAWINGS

The invention will be described by way of example with reference to the accompanying drawings, in which:

FIG. 2 shows schematically a cross-section through the magnet and coil arrangement of the apparatus of FIGS. 1a and b, FIG. 5 shows the magnetisation as a function of inter-pulse delay time (RD) for three different flow rates, 0.029, 0.601 and 1.254 l/s, corresponding to flow velocities of 3.95, 158 and 330 cm/s.

DETAILED DESCRIPTION OF EMBODIMENTS AND EXAMPLES

Figure 1A:
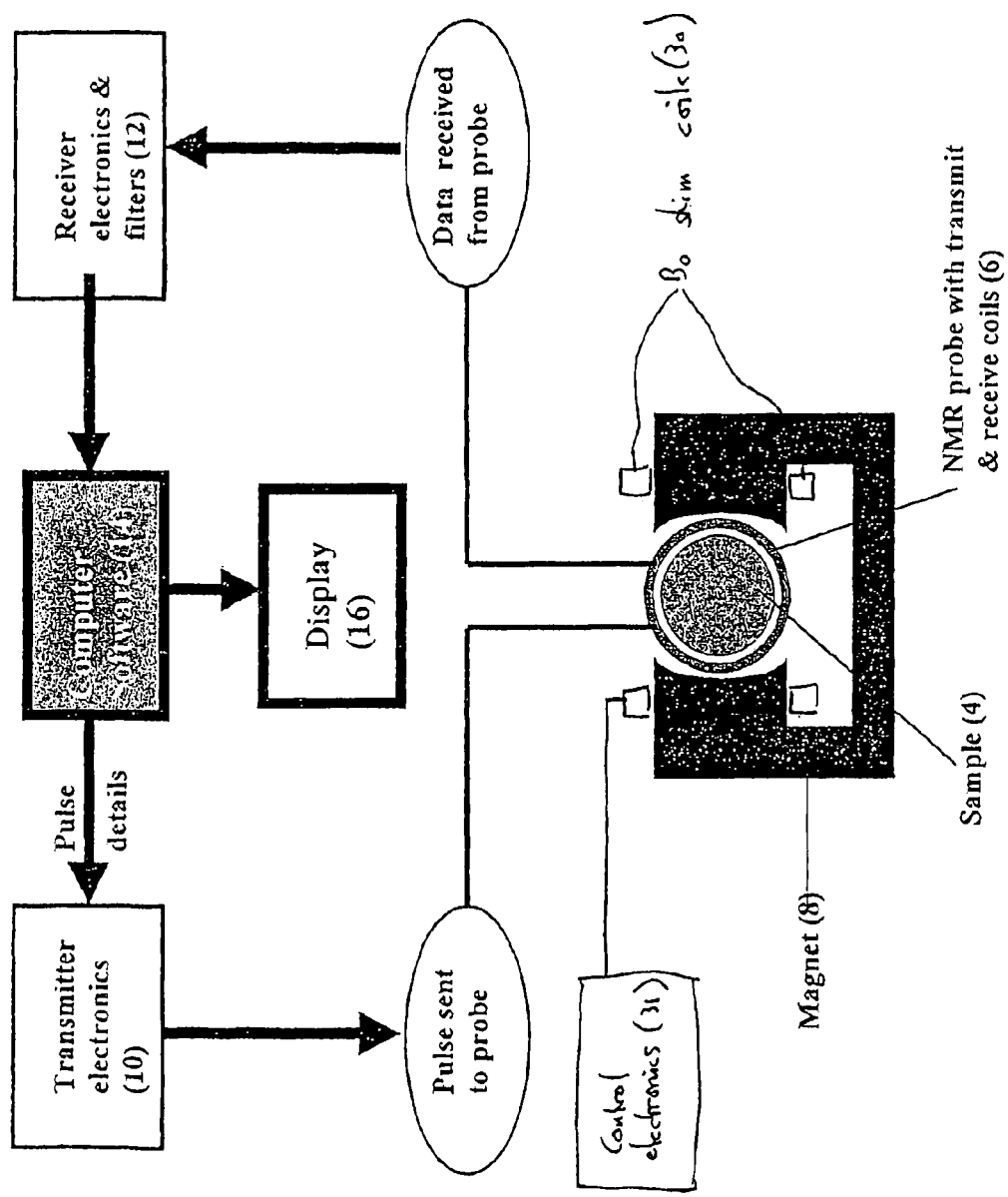
FIGS. 1a and b show schematically an apparatus for detecting inhomogeneities or dissolved species in a liquid flow.

Methods according to various aspects of the invention will be exemplified by way of a test which has been implemented using a 10.81 MHz bench-top NMR spectrometer. The system is illustrated schematically in FIGS. 1 and 2. Some implementations have been tested with a similar NMR spectrometer with a 0.066 T magnet (2.28 MHz).

Looking at the system as a whole, the main components are a non-ferromagnetic sample pipe 2, within which a liquid sample to be evaluated flows, an annular probe head 6 that surrounds the sample pipe 2, and hence the sample 4 itself, and a magnet 8 which partially surrounds the probe head 6, and current-carrying $B_0$ shim coils 30.

The magnet 8 provides a fixed strength, non-oscillating magnetic field, and $B_0$ shim coils 30 are arranged to produce a $B_0$ shim field which is parallel to and superimposed upon this non-oscillating field. The $B_0$ shim field is in the same or opposite direction to the main static field generated by magnet 8 and allows the strength of the non-oscillating $B_0$ filed to be adjusted if necessary. A simple and accurate way of driving the $B_0$ shim field is to provide a Helmholtz pair of $B_0$ shim coils (as shown in FIGS. 1a and 2), but with more coils or distributed windings, better homogeneity can be achieved. The probe head 6 both generates an oscillating magnetic field to excite the sample and serves as a detector for the resulting NMR signals from the sample.

The probe head is driven to generate its oscillating magnetic field in a pulse mode by conventional transmitter electronics 10. Further conventional control electronics 31 is configured to control the current to the $B_0$ shim coils 30 and hence the strength of the $B_0$ shim field. The control electronics should deliver a stable current (and hence field) and can be under control of computer software 14.

NMR signals detected by the probe 6 are collected by conventional receiver electronics 12. The transmitter and receiver electronics are controlled by a digital computer under the instruction of appropriate software 14. The software processes the received NMR signals (e.g. to produce FIDs or frequency domain spectra) and can display the signals or processed signals on an associated display 16.

The magnet 8 used in this exemplary bench-top system is a horseshoe-shaped magnet made from light weight, high temperature stable, bonded alloy. Other forms of magnet, including electromagnets may be used. An example of a particularly appropriate magnet, which is very compact and light weight, is described in U.S. Pat. No. 5,635,889.

The magnetic field generated by the horseshoe magnet 8 of the present example is 0.253 T. The polepiece 18 diameter is 125 mm with a 56 mm gap between the pole faces.

The probe head 6 includes a combined RF transmitter and receiver coil to perform both the magnetic field generation and NMR signal detection functions. The probe coil is solenoidal, of length 50 mm, wound on a PTFE body, and can take a sample pipe of up to 26 mm in diameter.

Used with the system described above, the probe 6, operating at 25 W, has a point of maximum sensitivity which is tunable. To an extent, this allows it to be tuned to a particular resonance of interest, i.e. characteristic of the specific nuclear species (e.g. elemental isotope) to be observed—typically $^1H$. However, other probe coils are available which can be switched in the system. For example, we have tested probe coils centred at about 2.28 MHz, 0.67 MHz and 0.18 MHz for the 0.066 T magnet.

However, in the present study, adjustment of the strength of the $B_0$ shim field to match the resonant frequency of the nuclei of interest to the frequency of the probe 6 could be used to supplement or replace tuning of the probe. This adjustment was achieved by varying the current through $B_0$ shim coils 30.

The magnet 8, $B_0$ shim coils 30, and probe head 6 are contained in a programmable temperature controlled enclosure (not shown). Further enclosures hold the associated electronics 10, 12, 31.

When the coil within the probe 6 is in resonance with the precessing nuclei of interest, data can be obtained in response to the type of pulse programme used. The computer both stores the pulse programme and controls the timings and way it is run. All the pulse programmes used in the tests are conventional.

Sequences of pulse-acquire events have been used for flow rate measurements, with a predetermined time delay between events. The programme is run when liquid is flowing through sample pipe and the variables in the programme optimised to give the largest signal. The pulse of radio-frequencies from the probe 6 nutates the nuclear magnetisation away from the static field direction, whereupon it precesses about the magnetic field at the Larmor frequency, and is detected by the receiver. The signal gradually decays, in an approximately exponential FID. This AC signal is digitised by an analogue to digital converter (ADC) and stored in the computer memory.

The FID for each pulse-acquire event plots as signal amplitude against time. Each FID is integrated between predetermined time limits so that when successive integrals are compared, a measure of signal decay magnitude is obtained. Typically the pulse-acquire events are repeated many times and corresponding integrals added together to improve the signal to noise ratio.

All software programmable control and data analysis is carried out using a PC computer interfaced with the spectrometer through conventional electronics. The software is provided by the manufacturer of the bench-top NMR system.

Spin echo and repetition delay experiments (described below) were performed using the 0.253 T spectrometer and a laboratory flow apparatus comprising a constantly fed constant-head device which provided flow regulated by a needle valve with a flow calibration. 2.85 mM copper sulphate solution in water was used for the flow medium. The signal was collected from $^1H$ nuclei and the copper sulphate solution had a $T_1$ of 300 ms. A range of flow rates between 0 and 3.18 cm/s was investigated.

Spin Echo Experiment

A FID was collected using a single-echo pulse sequence i.e. a 90 degree pulse was followed by a 180 degree pulse. The delay between the 90 degree pulse and the 180 degree pulse ($\tau$) equalled the delay between the 180 degree pulse and the start of data acquisition. This sequence was repeated 16 times and averaged to obtain data at an acceptable signal-to-noise level. A measure of the magnitude of the final averaged signal acquired was obtained using the integration of the middle section of the FID, before repeating the full sequence several times each with a different $\tau$.

Figure 3:
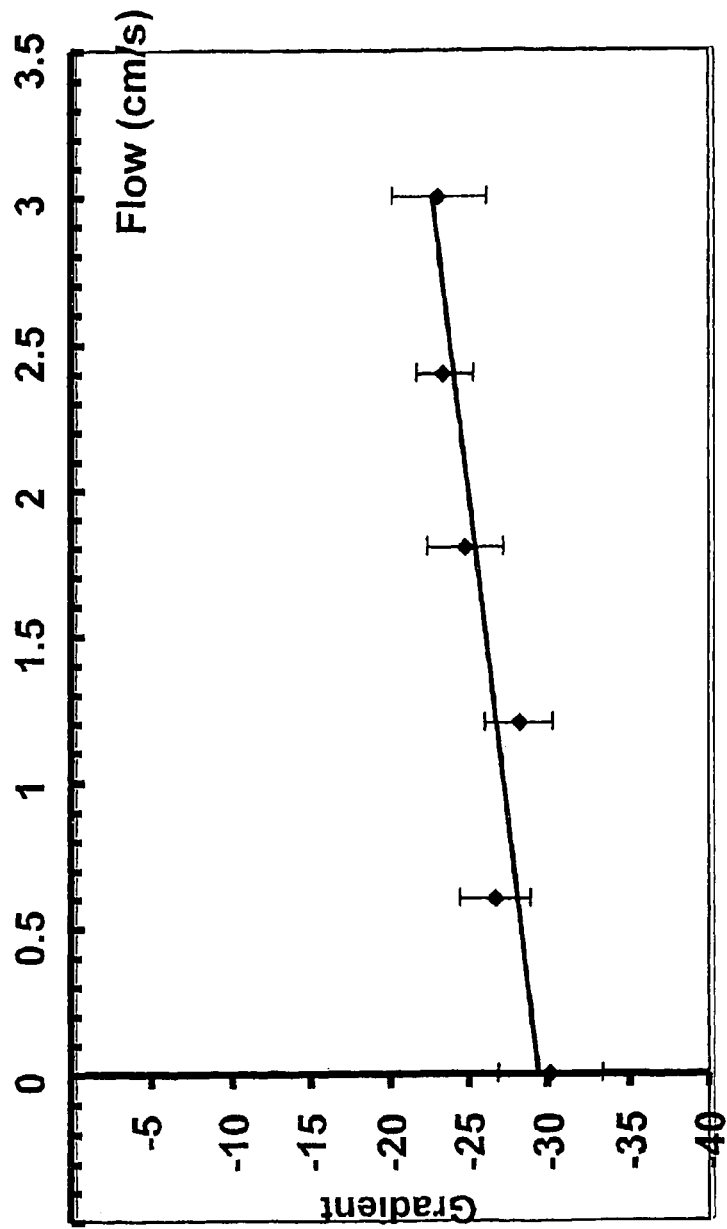
FIG. 3 shows a plot of gradient of the signal magnitude on τ against flow rate.

The relationship between $\tau$ and signal magnitude is approximately linear over a range of $\tau$ values, which was determined as part of the calibration of the system. For this example the values of $\tau$ used varied between 1 and 8 milliseconds. As shown in FIG. 3, the gradient of the signal magnitude on $\tau$ was linearly related to the average flow rate of the nuclei within the coil. This therefore demonstrates that such a gradient can (a) be determined by calibration and (b) thereafter used to measure flow rate.

Repetition Delay Experiment

A FID was collected using a simple pulse-acquire pulse programme and repeated consecutively to enable averaging until an acceptable signal-to-noise level was obtained (16 repetitions). The delay time between consecutive pulse-acquire sequences (the inter-pulse delay) was set so that it was insufficient for complete relaxation of the nuclei under observation but long enough to acquire data. Each of the FIDs acquired was preceded by a train of eight pulses identical with those described above but from which no data were acquired (dummy pulses). The sequence of dummy pulses allows the system to achieve equilibrium. A measure of the magnitude of the final averaged signal acquired was obtained using the integration of the middle section of the FID, before repeating the full sequence several times each with a different inter-pulse delay.

Figure 4:
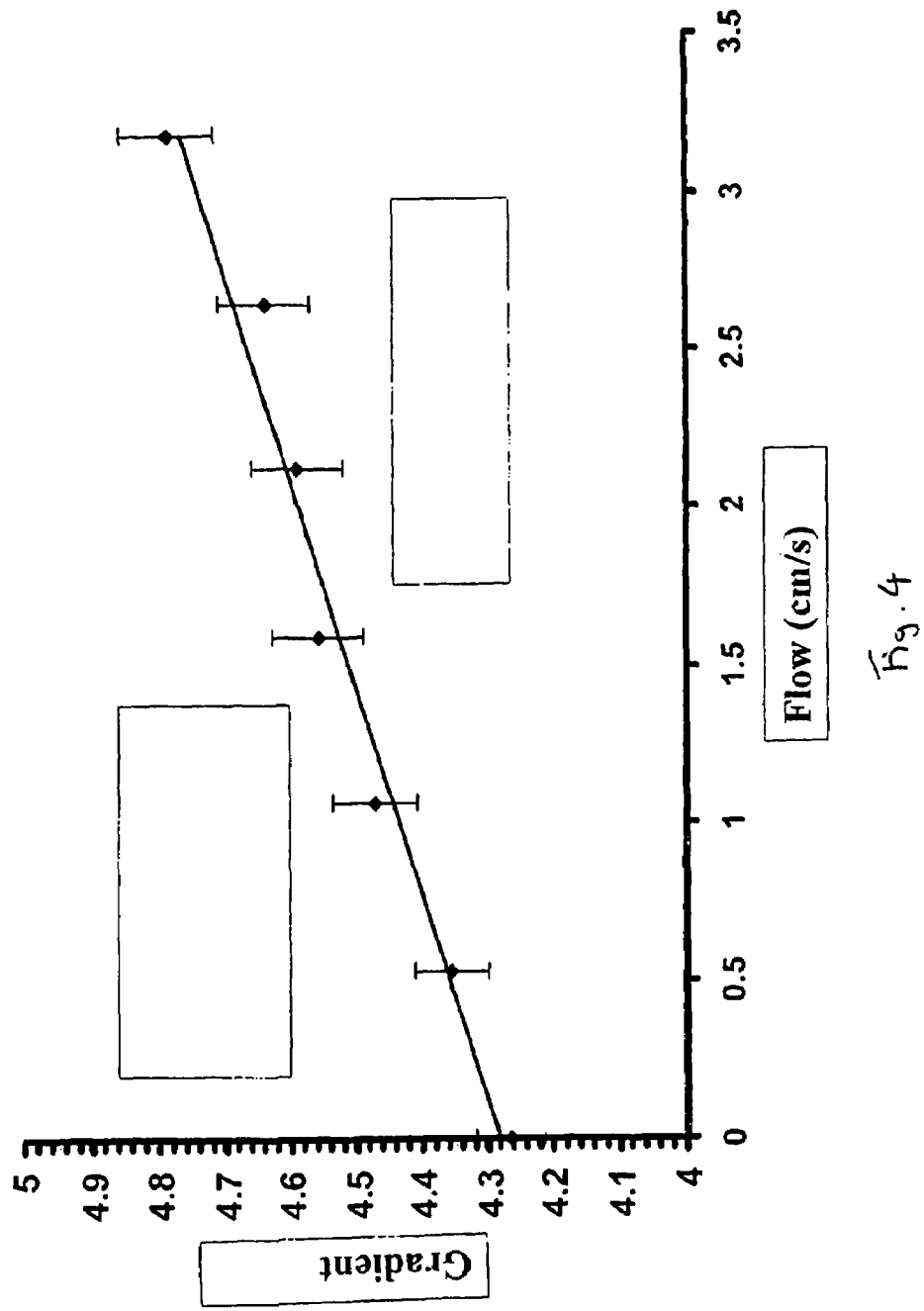
FIG. 4 shows a plot of gradient of the signal magnitude on inter-pulse delay against flow rate.

The relationship between inter-pulse delay and signal magnitude is linear over a range of inter-pulse delay values, which was determined as part of the calibration of the system. For this experiment values of the inter-pulse delays varied between 20 and 160 milliseconds. As shown in FIG. 4, the gradient of the signal magnitude on inter-pulse delay was linearly related to the average flow rate of the nuclei within the coil. This therefore demonstrates that such a gradient can (a) be determined by calibration and (b) thereafter used to measure flow rate.

Simple Pulse Acquire Experiment

A FID was collected using a simple pulse acquire program and repeated consecutively to enable averaging until an acceptable signal-to-noise level was obtained. The delay time between consecutive acquire sequences (the inter-pulse delay) was set to be sufficiently long for data acquisition and to satisfy the condition that all spins excited by one radiofrequency pulse leave the detection coil before the next pulse is applied (v (flow velocity)×RD (inter-pulse delay time)>1 (length of radiofrequency coil).

The initial magnitude of the signal is related to the flow velocity (more precisely, it is inversely proportional to it in the high flow regime), and can be estimated by extrapolating the FID back to time zero (the centre of the radiofrequency pulse), or alternatively, from the area of the Fourier transform of the FID (which should correspond to the initial point in the time domain signal). The method of integrating the centre section of the FID as described for the "Repetition Delay Experiment" is not in this case the method of choice as the rate of decay of the FID depends on the flow velocity and complicates the analysis in high flow regimes.

After calibration, the flow can be determined directly from the initial magnetisation.

FIG. 5 shows the magnetisation as a function of inter-pulse delay time (RD) for three different flow rates, 0.029, 0.601 and 1.254 l/s, corresponding to flow velocities of 3.95, 158 and 330 cm/s. The 0.066 T spectrometer was used for these experiments.

For low RD values (i.e. relatively low flow rates) the signal magnitude increases with RD and the initial slope provides a measure of flow. This is the regime corresponding to the "Repetition Delay Experiment" section described above. However, at longer RD values (relatively high flow rates), the signal becomes independent of RD, and the asymptotic value provides a measure of flow.

Note that the FIG. 5 measurements were carried out by integration of the middle part of the FID, leading to a relatively complicated relationship between magnetisation and flow velocity in the asymptotic region. In order to obtain a simple inverse proportional relationship between magnetisation and flow velocity, it is preferred to determine the initial magnitude of the FID by extrapolating the FID back to time zero rather than integrating the middle part of the FID.

The invention claimed is:

1. A method for measuring fluid flow rates comprising the steps of:
   (a) creating a non-oscillating magnetic field of a predetermined field strength across a flowing fluid, the fluid having a sufficiently high flow rate such that the time nuclei in the fluid spend being polarized by the non-oscillating magnetic field is proportional to the flow rate;
   (b) repeatedly performing the sub-steps of:
      (i) exposing the flowing fluid to an oscillating magnetic field pulse orthogonal to the non-oscillating magnetic field to generate an NMR signal, and
      (ii) using a detection coil to detect the NMR signal from the flowing fluid in the form of a free induction decay,
   a delay being applied between each repetition of sub-steps (i) and (ii), which delay is sufficient to allow substantially all the fluid exposed to the previous pulse to exit the detection coil before the next pulse is applied;
   (c) measuring initial magnitudes of the free induction decays; and
   (d) determining the fluid flow rate from the measured initial magnitudes, the measured initial magnitudes being inversely proportional to the flow rate.

2. A method according to claim 1, wherein, in step (c), the average initial magnitude of the free induction decay is measured.

3. A method according to claim 1, wherein the field strength of the first magnetic field does not exceed 1.5 T.

* * * * *